United States Patent
Ohkawa et al.

(10) Patent No.: US 8,106,859 B2
(45) Date of Patent: Jan. 31, 2012

(54) LIGHT EMITTING DEVICE, AREA LIGHT SOURCE APPARATUS AND IMAGE DISPLAY APPARATUS

(75) Inventors: Shingo Ohkawa, Saitama (JP); Takashi Oku, Kanagawa (JP); Kenichi Nakaki, Tokyo (JP); Tetsuo Shibanuma, Kanagawa (JP)

(73) Assignee: Sony Corporation, Tokyo (JP)

( * ) Notice: Subject to any disclaimer, the term of this patent is extended or adjusted under 35 U.S.C. 154(b) by 898 days.

(21) Appl. No.: 12/133,513

(22) Filed: Jun. 5, 2008

(65) Prior Publication Data

US 2008/0303757 A1   Dec. 11, 2008

(30) Foreign Application Priority Data

Jun. 6, 2007   (JP) ................................ 2007-150823

(51) Int. Cl.
*G09G 3/32*    (2006.01)

(52) U.S. Cl. ........ 345/82; 362/97.2; 362/97.3; 362/245; 362/327; 313/512; 257/100; 345/102; 345/76

(58) Field of Classification Search .................. 362/245, 362/327, 97.2, 97.3; 313/512; 257/100; 345/72–83, 102, 214

See application file for complete search history.

(56) References Cited

U.S. PATENT DOCUMENTS

| | | | | |
|---|---|---|---|---|
| 7,352,011 B2 * | 4/2008 | Smits et al. | ...................... | 257/99 |
| 7,422,347 B2 * | 9/2008 | Miyairi et al. | ................ | 362/335 |
| 7,448,783 B2 * | 11/2008 | Ohkawa | ........................ | 362/555 |
| 7,474,475 B2 * | 1/2009 | Paek et al. | ...................... | 359/726 |
| 7,489,453 B2 * | 2/2009 | Chinniah et al. | ............... | 359/727 |
| 7,524,098 B2 * | 4/2009 | Vennetier et al. | ............. | 362/555 |
| 7,540,635 B2 * | 6/2009 | Kim et al. | ...................... | 362/327 |
| 7,582,915 B2 * | 9/2009 | Hsing Chen et al. | ............ | 257/98 |
| 7,674,018 B2 * | 3/2010 | Holder et al. | ............ | 362/311.06 |
| 7,748,873 B2 * | 7/2010 | Kim et al. | ...................... | 362/328 |
| 7,781,787 B2 * | 8/2010 | Suehiro et al. | .................. | 257/98 |
| 7,810,962 B2 * | 10/2010 | Tahmosybayat | .............. | 362/329 |
| 7,819,560 B2 * | 10/2010 | Ohkawa | ........................ | 362/335 |
| 7,959,328 B2 * | 6/2011 | Wanninger | ..................... | 362/309 |
| 2006/0066218 A1 | 3/2006 | Yamaguchi et al. | | |
| 2006/0083003 A1 * | 4/2006 | Kim et al. | ...................... | 362/327 |
| 2006/0126343 A1 * | 6/2006 | Hsieh et al. | .................... | 362/327 |

FOREIGN PATENT DOCUMENTS

JP    3875247    11/2006

* cited by examiner

*Primary Examiner* — Lun-Yi Lao
*Assistant Examiner* — Gregory J Tryder
(74) *Attorney, Agent, or Firm* — SNR Denton US LLP

(57) ABSTRACT

Disclosed herein is a light emitting device, including: a light emitting diode; an sealing resin member having an arrangement face and configured to seal the light emitting diode; and a lens disposed on the arrangement face of the sealing resin member and formed so as to have a circular shape as viewed in the direction of an optical axis of light emitted from the light emitting diode, the lens having a concave portion formed at a central portion in such a manner as to be concave toward the sealing resin member.

8 Claims, 16 Drawing Sheets

FIG.10
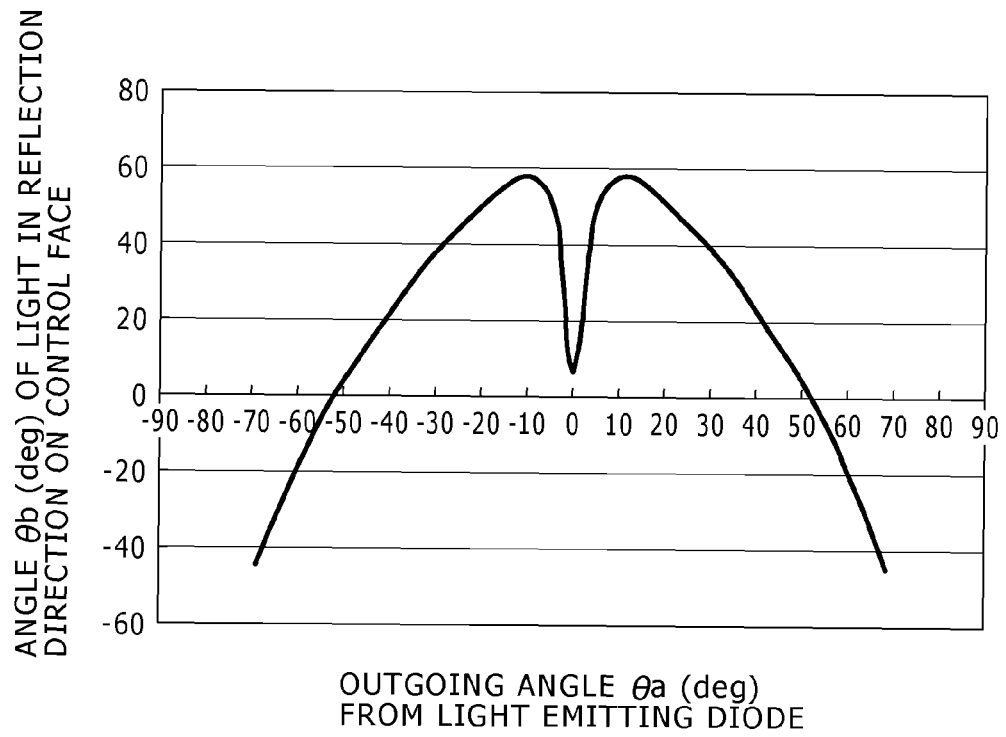
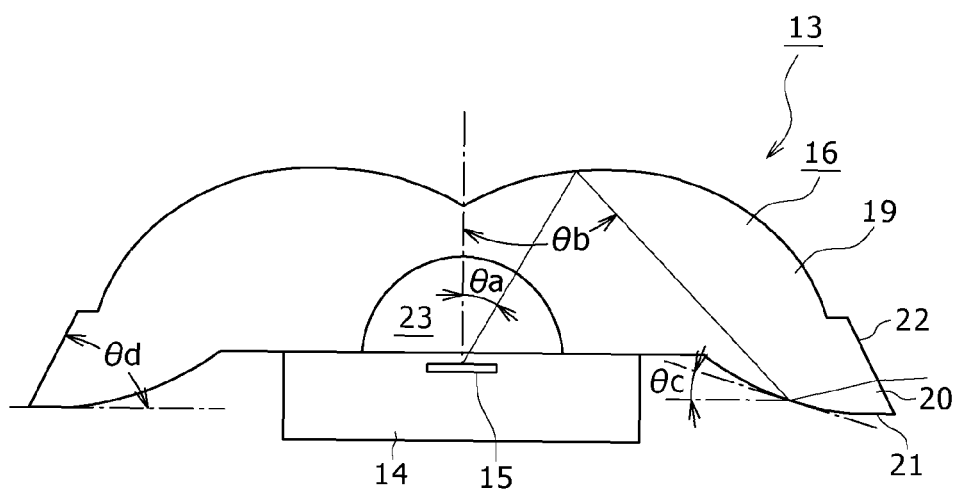

FIG. 15
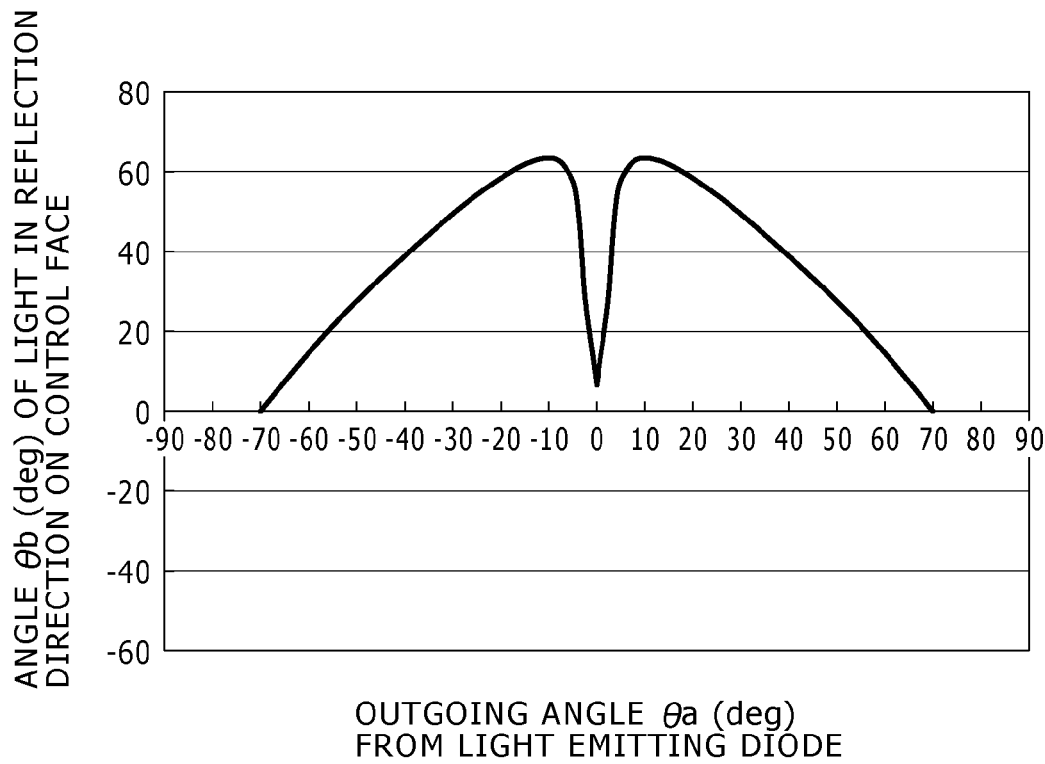
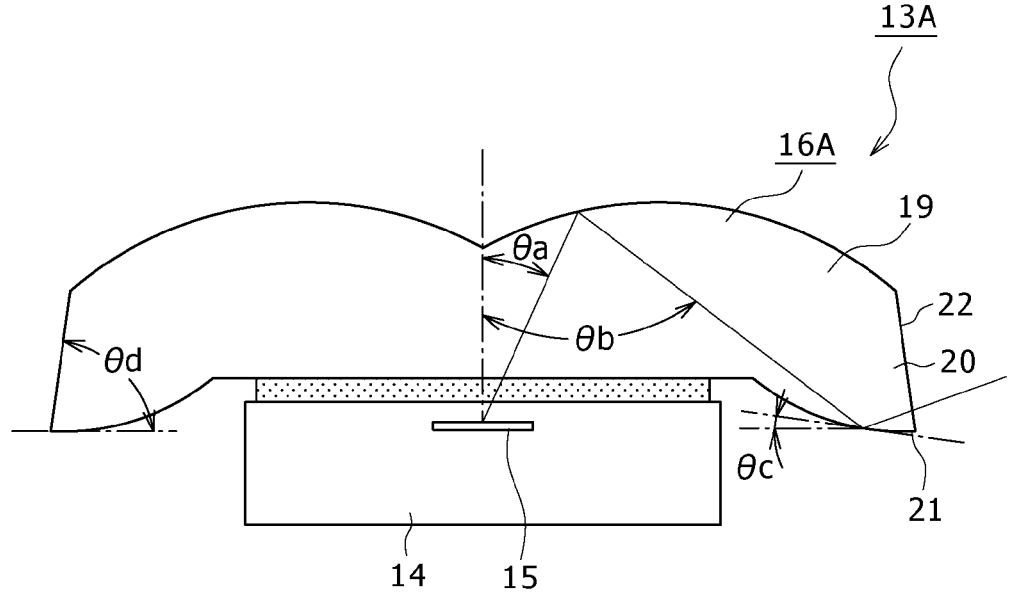

LIGHT EMITTING DEVICE, AREA LIGHT SOURCE APPARATUS AND IMAGE DISPLAY APPARATUS

CROSS REFERENCES TO RELATED APPLICATIONS

The present invention contains subject matter related to Japanese Patent Application JP 2007-150823 filed in the Japan Patent Office on Jun. 6, 2007, the entire contents of which being incorporated herein by reference.

BACKGROUND OF THE INVENTION

1. Field of the Invention

This invention relates to a light emitting device, an area light source apparatus and an image display apparatus.

2. Description of the Related Art

An illumination apparatus is available which illuminates using a plurality of light emitting devices each having a light emitting diode as a light source.

An illumination apparatus of the type described is used, for example, as an illuminator wherein the light source is utilized for direct illumination or is used in an image display apparatus such as a television receiver wherein the light source is used for backlight illumination.

In an image display apparatus such as a television receiver, a plurality of light emitting devices are disposed in a matrix, and light as backlight is emitted from the light emitting devices toward a display panel.

In the image display apparatus, when light is emitted from the light emitting devices, it is necessary to keep the uniformity in luminance over an overall area of the display panel. A light emitting device in the related art is disclosed in Japanese Patent No. 3,875,247 (hereinafter referred to as Patent Document 1) wherein, in order to assure the uniformity in luminance, light emitted from a light source is passed through a lens such that it is emitted so as to expand laterally from the lens and is irradiated upon the display panel.

Incidentally, in recent years, there is a tendency to reduce the thickness of an image display apparatus such as a television receiver. If it is tried to reduce the thickness of a light emitting device having the configuration of the light emitting device disclosed in Patent Document 1, then since the display panel is positioned nearer to the light emitting device, there is the possibility that the luminance of light emitted from a light emitting diode on the display panel on the front face side may become comparatively high, resulting in degradation of the uniformity in luminance over the overall area of the display panel.

Therefore, in order to increase the light emission amount to sideward directions to assure the uniformity in luminance, a light emitting device a has been proposed which uses a lens having such a shape as seen in FIG. 16. Referring to FIG. 16, the light emitting device a shown includes a light emitting diode b sealed in a sealing resin member c, and a lens d is disposed on the sealing resin member c. The lens d has a projecting portion e provided thereon such that it is positioned outwardly of the sealing resin member c and projects laterally. The lens d has an outer face f formed as a curved face and a bottom face g formed as a flat face.

If light is emitted from the light emitting diode b of the light emitting device a, then it goes out through the lens d while it is partly reflected inwardly by the outer face f of the lens d and then reflected inwardly by the bottom face g again, whereafter it goes out from the outer face f. In this manner, in the light emitting device a, since the light reflected inwardly by the outer face f and then reflected inwardly by the bottom face g again goes out from the projecting portion e positioned on the outer side with respect to the sealing resin member c, the light emitting amount toward lateral directions increases.

SUMMARY OF THE INVENTION

However, in the light emitting device a, since the bottom face g to which the light reflected inwardly by the outer face f comes is formed as a flat face, part of the light is not reflected inwardly by the bottom face g but passes through the bottom face g depending upon the angle thereof at which it arrives at the bottom face g. The light having passed through the bottom face g may possibly be reflected by various portions of the image display apparatus and may be directed at various angles toward the display panel.

Accordingly, there is the possibility that unevenness of luminance on the display panel may be caused by such light having passed through the bottom face g and may deteriorate the uniformity in luminance.

Therefore, it is demanded to provide a light emitting device, an area light source apparatus and an image display apparatus which achieve uniformization of the luminance.

According to an embodiment of the present invention, the uniformization of the luminance is achieved by providing, on an outer circumference of a lens, a light path controlling projecting portion for introducing light emitted from a light emitting diode to a predetermined direction.

In particular, the present invention provide a light emitting apparatus, an area light source apparatus and an image display apparatus configured such that a lens has a light path controlling projecting portion provided on an outer periphery thereof such that the light path controlling projecting portion is positioned outside of a sealing resin member and introduces light reflected inwardly by the lens to a predetermined direction, that the light path controlling projecting portion has formed thereon a reflecting face for reflecting the light reflected inwardly by the lens inwardly again and a light outgoing face provided continuously to an outer peripheral edge of the reflecting face for allowing the light reflected inwardly by the reflecting face to go out therethrough, that the reflecting face has an inner circumferential edge positioned on the emitting direction side of the light from a light emitting diode with respect to an outer circumferential edge thereof along the direction of the optical axis, that the reflecting face is formed as a curved face convex to the substantially opposite side to the emitting direction of the light from the light emitting diode along the direction of the optical axis, and the light outgoing face forms an outer circumferential face of the light path controlling projecting portion while the light outgoing face is inclined so as to be displaced away from the light emitting diode as the distance to the outer circumferential edge of the reflecting face decreases in the direction of the optical axis.

Accordingly, in the light emitting apparatus, area light source apparatus and image display apparatus, the light incoming to the light path controlling projecting portion is entirely or substantially entirely reflected inwardly by the light path controlling projecting portion and goes out from the light outgoing face of the lens.

More specifically, according to an embodiment of the present invention, there is provided a light emitting device including a light emitting diode, an sealing resin member having an arrangement face thereon and configured to seal the light emitting diode therein, and a lens disposed on the arrangement face of the sealing resin member and formed so as to have a circular shape as viewed in the direction of an optical axis of light emitted from the light emitting diode, the lens having a concave portion formed at a central portion thereof in such a manner as to be concave toward the sealing resin member, the lens being disposed on the arrangement face of the sealing resin member such that the concave portion of the lens is positioned on the optical axis of the light emitted from the light emitting diode, the light emitted from the light emitting diode partly passing through the sealing resin member, whereafter the light is reflected inwardly by the lens and goes out from the lens, the lens having a light path controlling projecting portion provided on an outer periphery thereof such that the light path controlling projecting portion is positioned outside of the sealing resin member and introduces the light reflected inwardly by the lens to a predetermined direction, the light path controlling projecting portion having formed thereon a reflecting face for reflecting the light reflected inwardly by the lens inwardly again and a light outgoing face provided continuously to an outer peripheral edge of the reflecting face for allowing the light reflected inwardly by the reflecting face to go out therethrough, the reflecting face having an inner circumferential edge positioned on the emitting direction side of the light from the light emitting diode with respect to an outer circumferential edge thereof along the direction of the optical axis, the reflecting face being formed as a curved face convex to the substantially opposite side to the emitting direction of the light from the light emitting diode along the direction of the optical axis, the light outgoing face forming an outer circumferential face of the light path controlling projecting portion while the light outgoing face is inclined so as to be displaced away from the light emitting diode as the distance to the outer circumferential edge of the reflecting face decreases in the direction of the optical axis.

With the light emitting apparatus, the amount of light which goes out laterally with respect to the optical axis from within the light emitted from the light emitting diode is great. Consequently, uniformity of the luminance can be assured.

Preferably, the lens and the sealing resin member define therebetween an air layer through which the light emitted from the light emitting diode passes. With the light emitting device, the light is refracted at the boundary surface between the sealing resin member and the air layer and at the boundary surface between the air layer and the lens so as to be directed laterally. Therefore, the amount of light to go out laterally can be increased.

Preferably, the light emitting device further include a transparent coupling layer provided between the lens and the sealing resin member for coupling the lens and the sealing resin member to each other. With the light emitting device, the lens and the coupling layer contact closely with each other and the coupling layer and the sealing resin member contact closely with each other. Therefore, an unnecessary gap is not formed between the lens and the sealing resin member, and consequently, light emitted from the light emitting diode is prevented from being directed to an unintended direction and control of the light can be carried out readily.

Preferably, the coupling layer and the sealing resin member have a substantially equal refractive index. With the light emitting device, interface reflection is less likely to occur at the boundary surface between the coupling layer and the sealing resin member, and improvement of the utilization efficiency of light can be achieved.

Preferably, the coupling layer is formed from a resin material in the form of gel. With the light emitting device, good close contact is assured between the lens and the coupling layer and between the coupling layer and the sealing resin member. Consequently, facilitation of the control of light emitted from the light emitting diode can be anticipated.

The coupling layer may be formed from an adhesive. With the light emitting device, there is no necessity to provide a securing element for the sealing resin member on the lens, and consequently, simplification in structure can be anticipated.

According to another embodiment of the present invention, there is provided an area light source apparatus including a plurality of light emitting devices each including a light emitting diode, an sealing resin member having an arrangement face thereon and configured to seal the light emitting diode therein, and a lens disposed on the arrangement face of the sealing resin member and formed so as to have a circular shape as viewed in the direction of an optical axis of light emitted from the light emitting diode, the lens having a concave portion formed at a central portion thereof in such a manner as to be concave toward the sealing resin member, and a diffusion section configured to diffuse the light emitted from the plural light source apparatus, the lens being disposed on the arrangement face of the sealing resin member such that the concave portion of the lens is positioned on the optical axis of the light emitted from the light emitting diode, the light emitted from the light emitting diode partly passing through the sealing resin member, whereafter the light is reflected inwardly by the lens and goes out from the lens, the lens having a light path controlling projecting portion provided on an outer periphery thereof such that the light path controlling projecting portion is positioned outside of the sealing resin member and introduces the light reflected inwardly by the lens to a predetermined direction, the light path controlling projecting portion having formed thereon a reflecting face for reflecting the light reflected inwardly by the lens inwardly again and a light outgoing face provided continuously to an outer peripheral edge of the reflecting face for allowing the light reflected inwardly by the reflecting face to go out therethrough, the reflecting face having an inner circumferential edge positioned on the emitting direction side of the light from the light emitting diode with respect to an outer circumferential edge thereof along the direction of the optical axis, the reflecting face being formed as a curved face convex to the substantially opposite side to the emitting direction of the light from the light emitting diode along the direction of the optical axis, the light outgoing face forming an outer circumferential face of the light path controlling projecting portion while the light outgoing face is inclined so as to be displaced away from the light emitting diode as the distance to the outer circumferential edge of the reflecting face decreases in the direction of the optical axis.

With the area light source apparatus, the amount of light which goes out laterally with respect to the optical axis from within the light emitted from the light emitting diode is great. Consequently, uniformity of the luminance can be assured.

According to a further embodiment of the present invention, there is provided an image display apparatus including a plurality of light emitting devices each including a light emitting diode, an sealing resin member having an arrangement face thereon and configured to seal the light emitting diode therein, and a lens disposed on the arrangement face of the sealing resin member and formed so as to have a circular shape as viewed in the direction of an optical axis of light emitted from the light emitting diode, the lens having a concave portion formed at a central portion thereof in such a manner as to be concave toward the sealing resin member, a diffusion section configured to diffuse the light emitted from the plural light source apparatus, and a display panel upon which the light emitted from the plural light emitting devices is irradiated to display an image thereon, the lens being disposed on the arrangement face of the sealing resin member such that the concave portion of the lens is positioned on the optical axis of the light emitted from the light emitting diode, the light emitted from the light emitting diode partly passing through the sealing resin member, whereafter the light is reflected inwardly by the lens and goes out from the lens, the lens having a light path controlling projecting portion provided on an outer periphery thereof such that the light path controlling projecting portion is positioned outside of the sealing resin member and introduces the light reflected inwardly by the lens to a predetermined direction, the light path controlling projecting portion having formed thereon a reflecting face for reflecting the light reflected inwardly by the lens inwardly again and a light outgoing face provided continuously to an outer peripheral edge of the reflecting face for allowing the light reflected inwardly by the reflecting face to go out therethrough, the reflecting face having an inner circumferential edge positioned on the emitting direction side of the light from the light emitting diode with respect to an outer circumferential edge thereof along the direction of the optical axis, the reflecting face being formed as a curved face convex to the substantially opposite side to the emitting direction of the light from the light emitting diode along the direction of the optical axis, the light outgoing face forming an outer circumferential face of the light path controlling projecting portion while the light outgoing face is inclined so as to be displaced away from the light emitting diode as the distance to the outer circumferential edge of the reflecting face decreases in the direction of the optical axis.

With the image display apparatus, the amount of light which goes out laterally with respect to the optical axis from within the light emitted from the light emitting diode is great. Consequently, uniformity of the luminance can be assured.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 10 is a graph illustrating a relationship between the outgoing angle from a light emitting diode and the angle of a reflection direction of light on the controlling face and illustrating different angles of the reflection direction;

FIG. 15 is a graph illustrating a relationship between the outgoing angle from the light emitting diode and the angle of a reflection direction of light on the controlling face in the modified light emitting device and illustrating different angles of the reflection direction.

DETAILED DESCRIPTION OF THE PREFERRED EMBODIMENT

In the following, a light emitting device, an area light source apparatus and an image display apparatus according to a preferred embodiment of the present invention are described with reference to the accompanying drawings.

In the preferred embodiment of the present invention described below, the image display apparatus according to an embodiment of the present invention is applied to a television receiver for displaying an image on a liquid crystal panel. Further, the area light source apparatus according to another embodiment of the present invention is applied to an area light source apparatus used in the television receiver, and the light emitting device according to a further embodiment of the present invention is applied to a light emitting device used in the area light source apparatus.

It is to be noted that the application of the present invention is not limited to any of a television receiver having a liquid crystal panel and an area light source apparatus and a light emitting device used in the television receiver. The present invention can be applied widely to various other television receivers, image display apparatus used in personal computers, and various area light source apparatus and light emitting devices used in such television receivers, image display apparatus and so forth.

Figure 1:
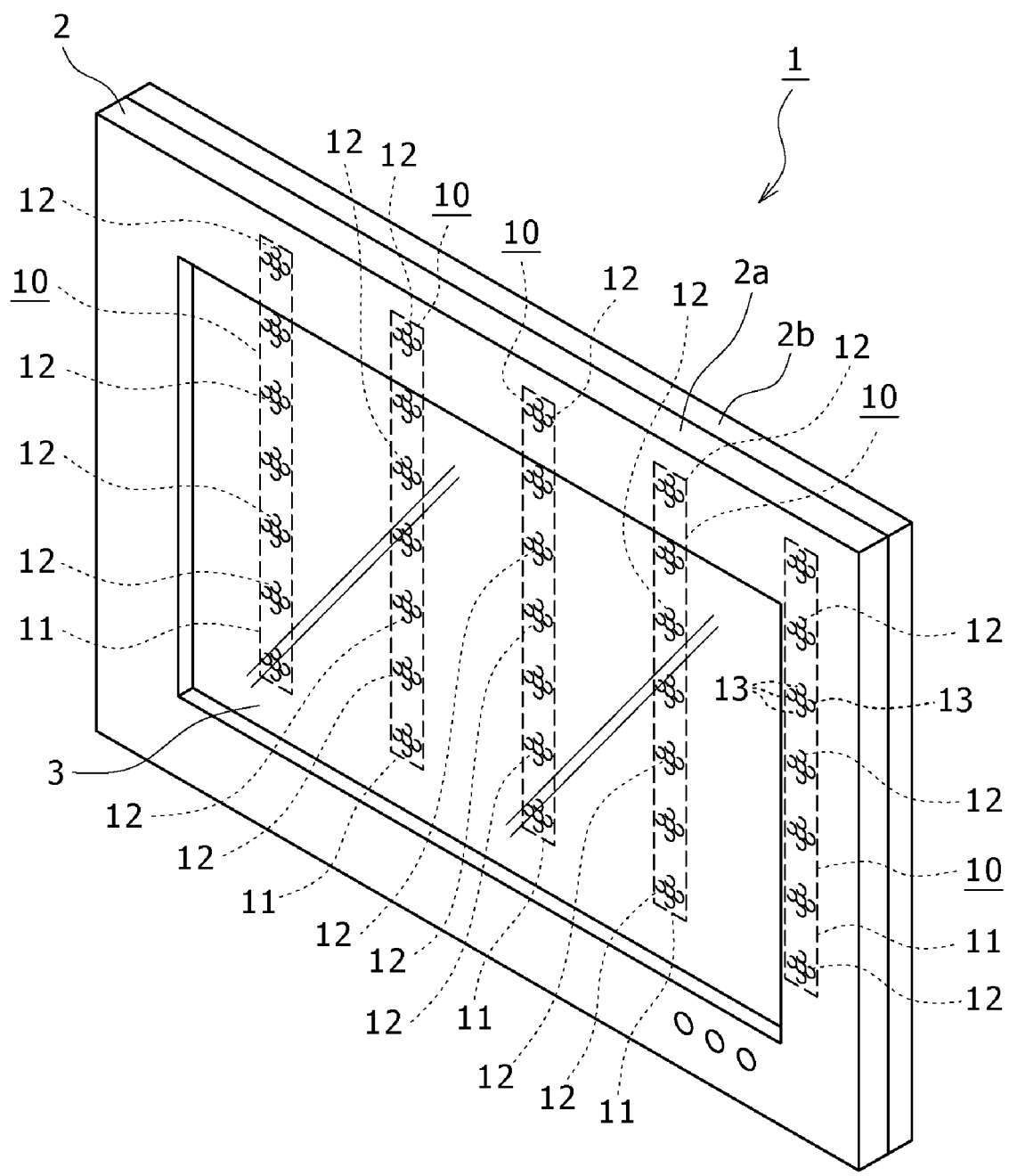
FIG. 1 is a schematic perspective view showing an image display apparatus to which the present invention is applied.
Figure 2:
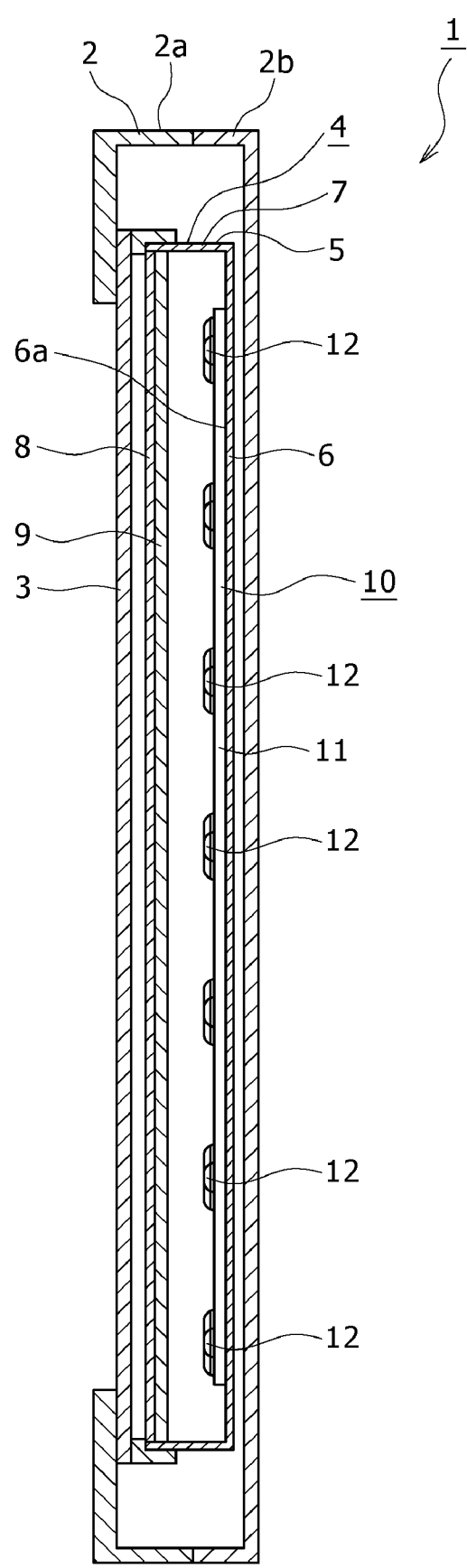
FIG. 2 is a schematic vertical sectional view of the image display apparatus.

Referring first to FIGS. 1 and 2, there is shown an image display apparatus or television receiver 1 according to the embodiment of the present invention. The image display apparatus 1 includes an outer housing 2 in which necessary components are disposed. The outer housing 2 includes a front panel 2a and a rear panel 2b coupled forwardly and backwardly to each other.

The front panel 2a of the outer housing 2 has an opening formed therein such that it extends forwardly and backwardly therethrough, and a display panel 3 for displaying an image is disposed at a position of the outer housing 2 at which it closes up the opening from the inner side. The display panel 3 is formed from a color liquid crystal panel of the transmission type held between two polarizing plates from the front and rear sides and displays a full color image by being driven in accordance with an active matrix system.

An area light source apparatus 4 is disposed in the inside of the outer housing 2 as seen in FIG. 2. The area light source apparatus 4 includes several components disposed at demanded portions in a housing 5.

The housing 5 is formed as a flattened box made of a metal material or the like having a high thermal conductivity and opened forwardly. The housing 5 includes an arrangement face portion 6 directed in forward and backward directions, and peripheral faces 7 projecting forwardly from an outer peripheral edge of the arrangement face portion 6.

An optical sheet 8 and a diffuser 9 are attached to a front end of the housing 5.

The optical sheet 8 includes various sheets having various optical functions and disposed in layers. The sheets include a prism sheet for refracting light emitted from a light source in the form of a light emitting diode hereinafter described to introduce the light to a predetermined direction, and a polarization direction conversion sheet for converting the polarization direction of light.

The optical sheet 8 is pasted to the front face of the diffuser 9 and disposed in an opposing relationship to the light source. The diffuser 9 functions as a diffusion section for diffusing light emitted from the light source in the inside of the housing 5 to reduce luminance dispersion in the display panel 3.

One of the opposite faces of the arrangement face portion 6 of the housing 5, that is, a front face 6a, has a plurality of light source units 10 disposed thereon, for example, in an equally spaced relationship from each other in leftward and rightward directions as seen in FIGS. 1 and 2. Each of the light source units 10 includes a plurality of light emitting units 12 disposed, for example, in an equally spaced relationship from each other in a vertical direction on a vertically elongated circuit board 11. Such circuit boards 11 are disposed in a spaced relationship from each other in the leftward and rightward directions.

Each of the light emitting units 12 includes four light emitting devices 13 as seen in FIG. 1. The light emitting devices 13 of each light emitting unit 12 include a light emitting device 13 for emitting red light, two light emitting devices 13 for emitting green light and a light emitting device 13 for emitting blue light. It is to be noted that the configuration of the light emitting units 12 is not limited to the specific configuration described, but each light emitting unit 12 may be configured arbitrarily in regard to the number of such light emitting devices 13 and the colors of light to be emitted from the light emitting devices 13.

Figure 3:
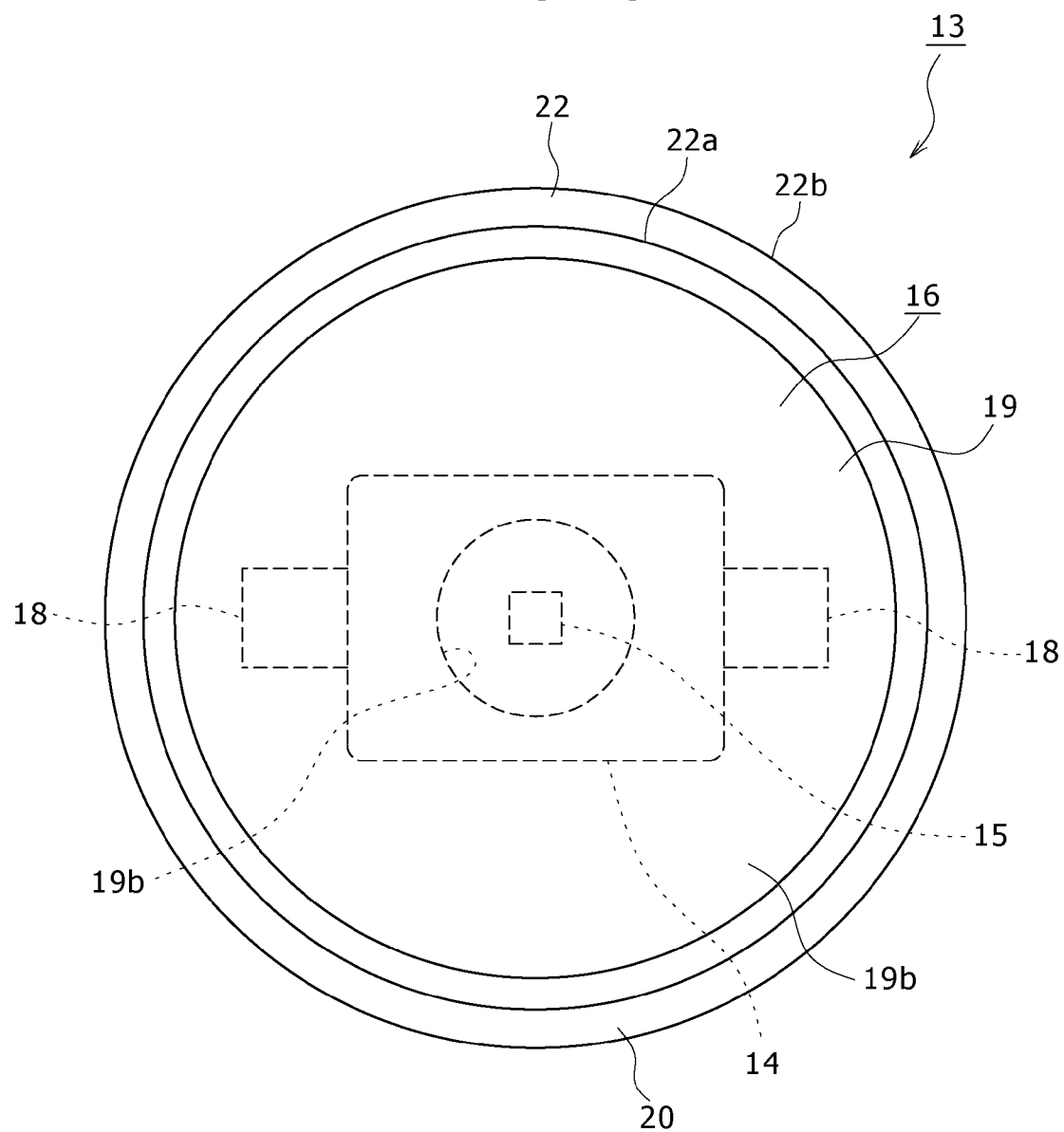
FIG. 3 is an enlarged front elevational view of a light emitting device to which the present invention is applied.
Figure 4:
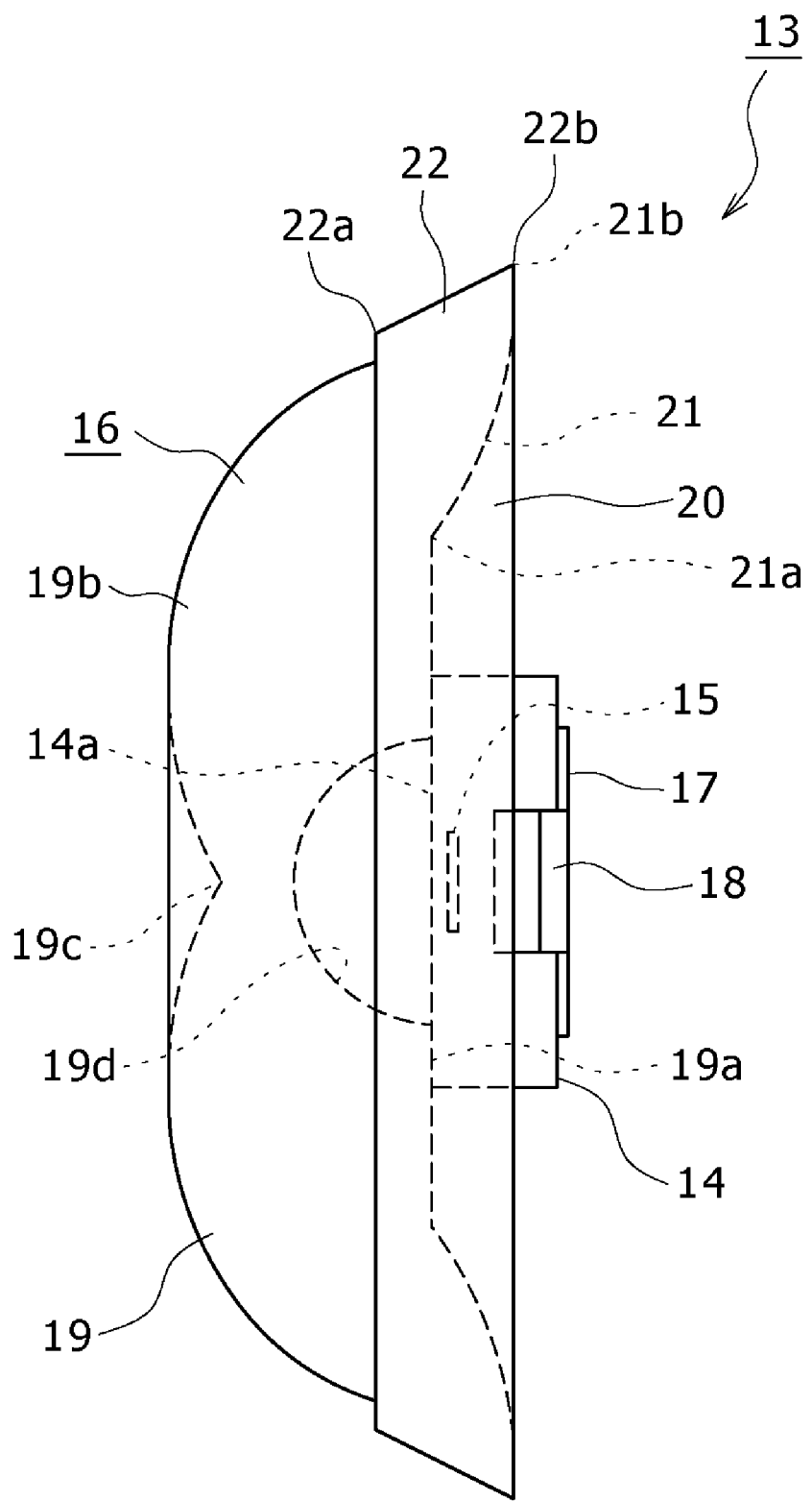
FIG. 4 is an enlarged side elevational view of the light emitting device.
Figure 5:
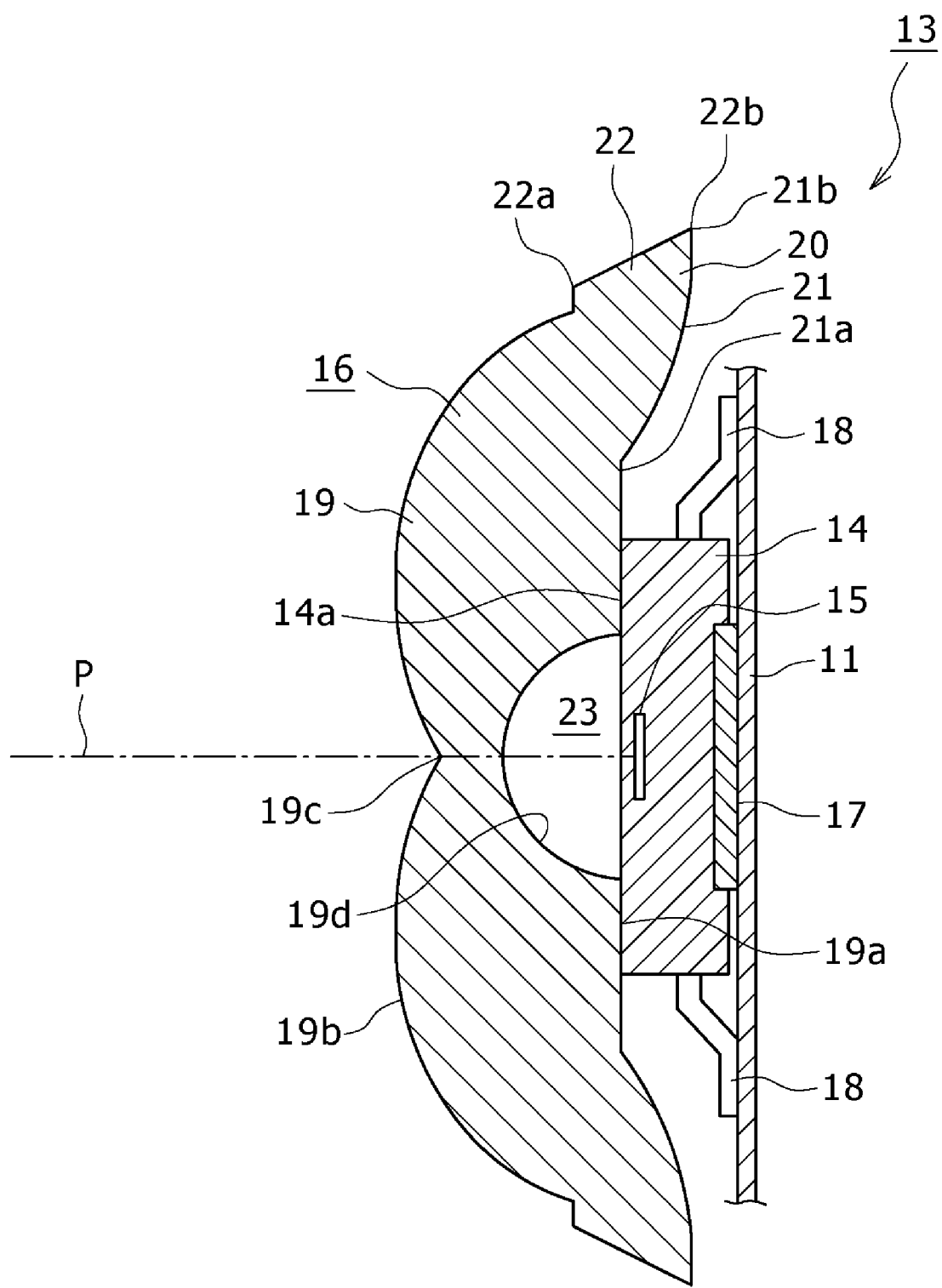
FIG. 5 is an enlarged sectional view of the light emitting device in a state wherein it is disposed on a circuit board.

Referring now to FIGS. 3 to 5, each of the light emitting devices 13 includes a sealing resin member 14, a light emitting diode 15 which functions as a backlight light source, and a lens 16 disposed on the sealing resin member 14.

The sealing resin member 14 is formed substantially as a block. The sealing resin member 14 has a front face serving as an arrangement face 14a. A heat radiation plate 17 is attached to a rear face of the sealing resin member 14 and has a function of radiating heat generated from the light emitting diode 15 when it is driven.

The light emitting diode 15 is disposed in a state wherein it is buried in the sealing resin member 14. A pair of connection terminals 18 are connected to the light emitting diode 15 and partly project laterally from the sealing resin member 14.

The lens 16 is made of a transparent resin material such as a polycarbonate resin material and is formed in a circular shape as viewed in the direction of an optical axis of light emitted from the light emitting diode 15. The lens 16 is disposed on the arrangement face 14a such that the center axis thereof coincides with an optical axis P as seen in FIG. 5.

The lens 16 includes a body portion 19, and a light path controlling projecting portion 20 formed integrally with the body portion 19 and provided continuously to an outer periphery of the body portion 19. The body portion 19 has an attached face 19a in the form of a flat face directed rearwardly and formed with an outer periphery which is displaced rearwardly as the distance from the center of the lens 16 increases, and a controlling face 19b formed as a curved face and directed forwardly or laterally. A concave portion 19c is provided at a central portion of the body portion 19 such that it is concave toward the rear side. A semispherical recess 19d is formed on the attached face 19a side of the body portion 19 such that it is opened rearwardly.

The light path controlling projecting portion 20 is provided in such a manner as to project obliquely outwardly rearwards from an outer periphery of the body portion 19 and is positioned on the outer circumference side of the sealing resin member 14. The light path controlling projecting portion 20 has a reflecting face 21 directed substantially rearwardly, and a light outgoing face 22 which forms an outer circumferential face of the light path controlling projecting portion 20. The reflecting face 21 has an inner circumferential edge 21a coincident with an outer circumferential edge of the attached face 19a of the body portion 19. The reflecting face 21 is formed as a moderate curved face which is convex substantially rearwardly such that it is displaced rearwardly as the rearward distance thereof increases. The light outgoing face 22 is inclined so as to be displaced rearwardly as the rearward distance thereof increases. A front edge 22a of the light outgoing face 22 is positioned on the inner side with respect to a rear edge 22b of the light outgoing face 22, and the rear edge 22b coincides with an outer circumferential edge 21b of the reflecting face 21.

The lens 16 is disposed such that the attached face 19a thereof contacts with the arrangement face 14a of the sealing resin member 14. A plurality of caulking pins not shown, for example, which project rearwardly from the attached face 19a are provided on the lens 16 and fitted in and caulked to the sealing resin member 14 to secure the lens 16 to the sealing resin member 14.

In the state wherein the lens 16 is secured to the sealing resin member 14, the semispherical recess 19d of the body portion 19 has a form of an enclosed space, by which an air layer 23 is formed.

The light emitting device 13 having the configuration described above is connected at end portions of the connection terminals 18 thereof to a circuit pattern not shown on the circuit board 11. At this time, the heat radiation plate 17 is disposed in contact with a heat transmitting portion not shown of the circuit board 11.

Figure 6:
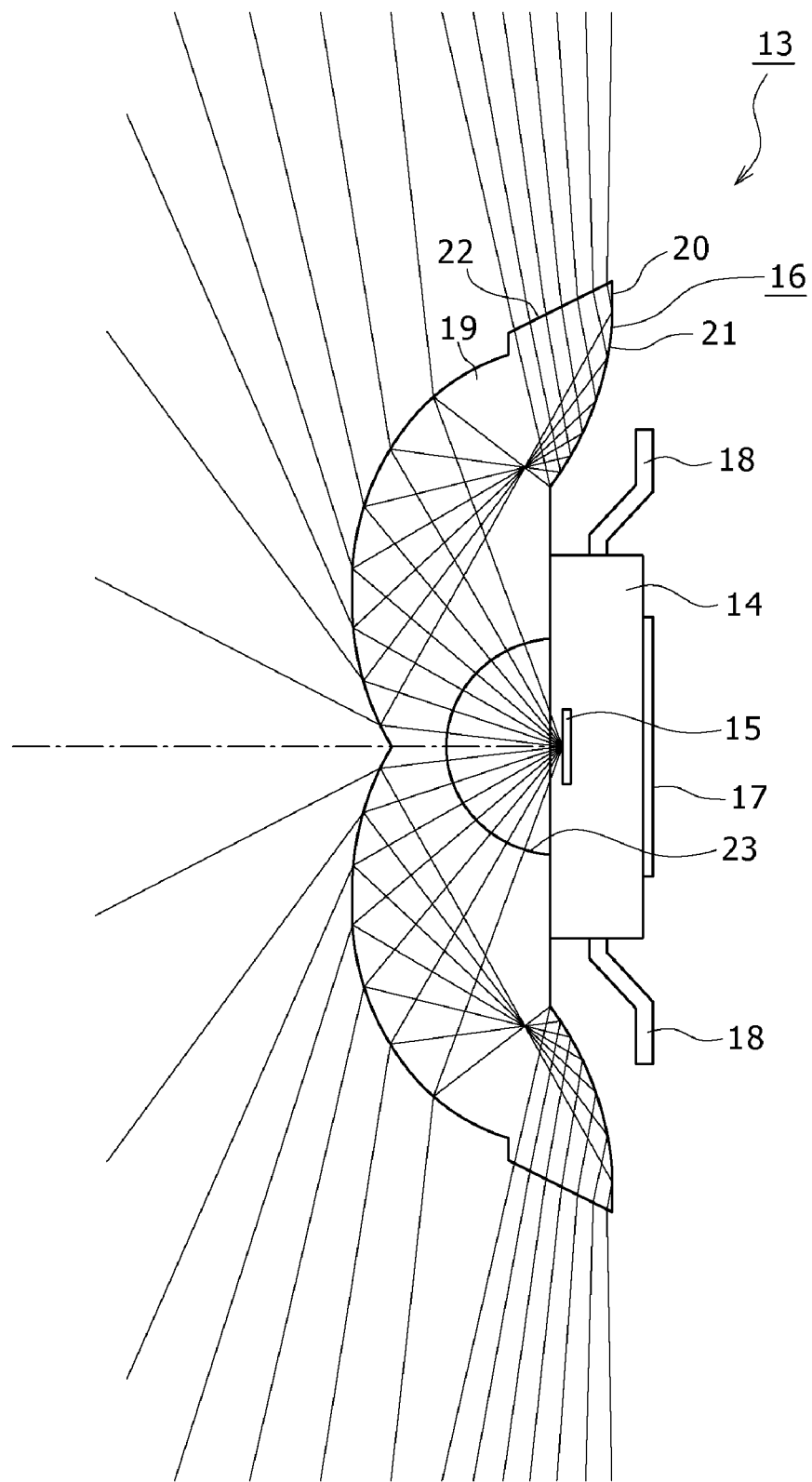
FIG. 6 is a schematic view illustrating paths of light emitted from a light emitting diode of the light emitting device.

If light is emitted from the light emitting diode 15 of the light emitting device 13, then the emitted light advances at a predetermined outgoing angle toward the controlling face 19b and the lens 16 as seen in FIG. 6. At this time, if the outgoing angle is any other than 0°, then the light is refracted at the boundary surface between the sealing resin member 14 and the air layer 23 so as to be directed laterally and then is further refracted at the boundary surface between the air layer 23 and the body portion 19 so as to be directed laterally so that it thereafter reaches the controlling face 19b.

In this manner, in the light emitting device 13, since the air layer 23 through which light emitted from the light emitting diode 15 passes is formed between the lens 16 and the sealing resin member 14, the light is refracted at the boundary surface between the sealing resin member 14 and the air layer 23 and the boundary between the air layer 23 and the lens 16 so as to be directed laterally. Consequently, the amount of light to be directed laterally can be increased.

Light arriving at the controlling face 19b goes out from the controlling face 19b except part thereof at a ratio based on the incoming angle to the controlling face 19b and passes through the diffuser 9 and the optical sheet 8 until it arrives at the display panel 3.

The part of light arriving at the controlling face 19b is reflected inwardly by the controlling face 19b and advances toward the reflecting face 21 of the light path controlling projecting portion 20. The light advancing toward the reflecting face 21 is reflected inwardly by the reflecting face 21 again and advances toward the light outgoing face 22, whereafter it goes out from the light outgoing face 22 and passes through the diffuser 9 and the optical sheet 8 until it arrives at the display panel 3.

Figure 7:
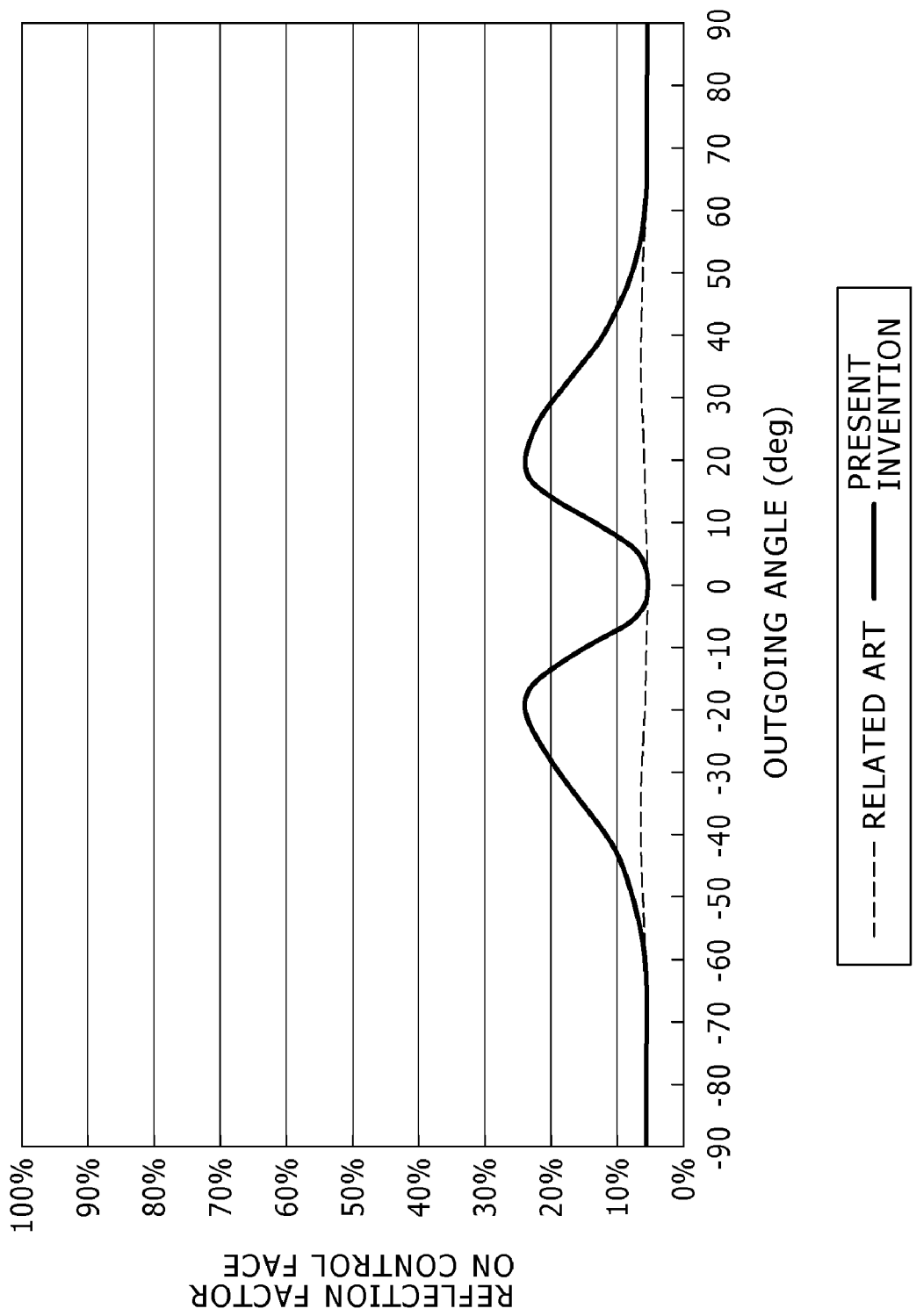
FIG. 7 is a graph illustrating relationships between the outgoing angle and the reflection factor on a controlling face in a light emitting device in the related art and the light emitting device of FIG. 3 for comparison.
Figure 16:
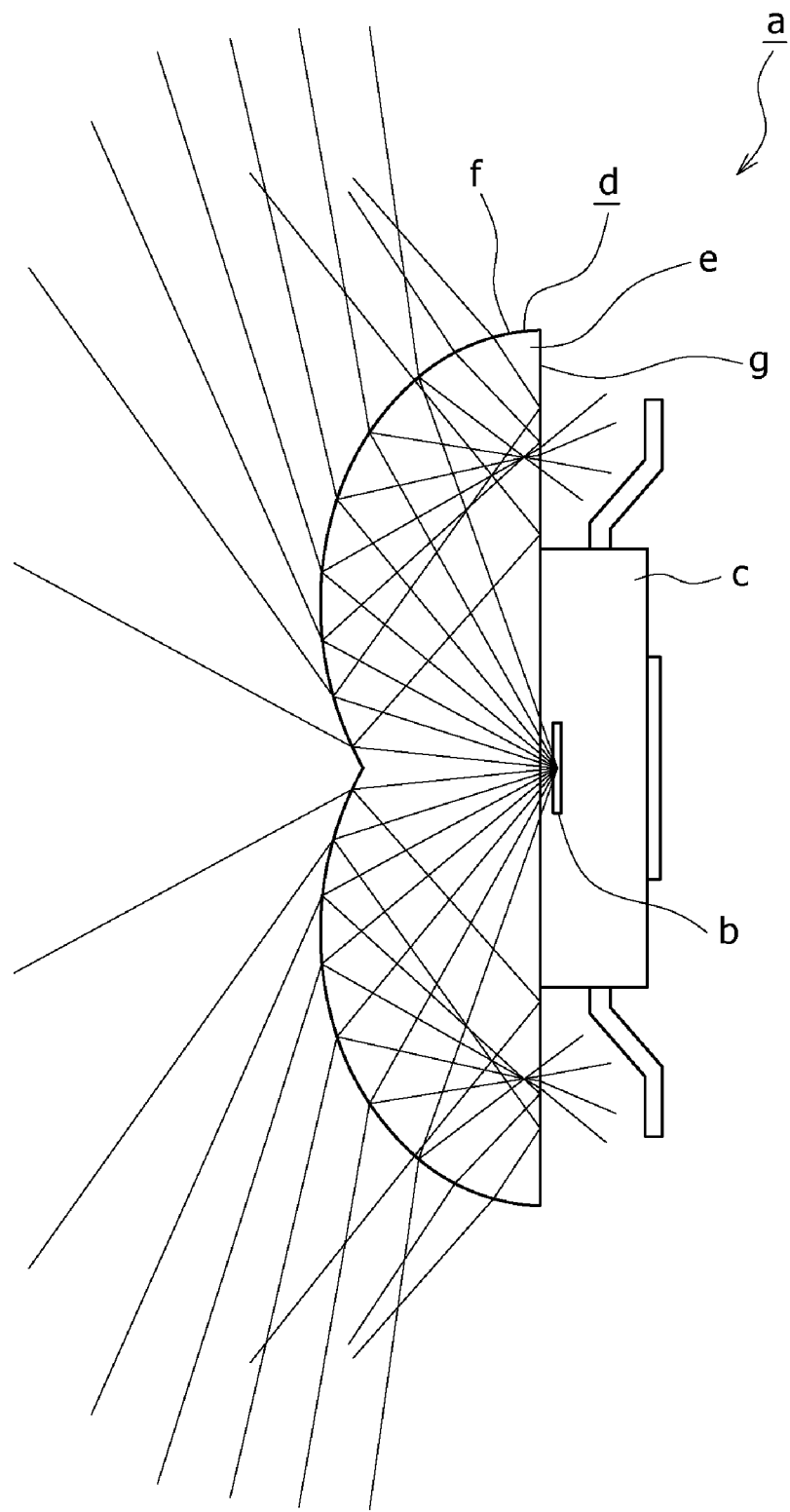
FIG. 16 is a schematic view illustrating paths of light emitted from a light emitting diode of a light emitting device in the related art.

FIG. 7 is a graph illustrating relationships between the outgoing angle and the reflection factor on the controlling face, that is, the ratio of inward reflection, in the light emitting device in the related art described hereinabove with reference to FIG. 16 and the light emitting device 13 for comparison. Referring to FIG. 7, the outgoing angle of 0° is an angle where light is emitted in the direction of the optical axis. In the light emitting device in the related art, the reflection factor is substantially fixed irrespective of the outgoing angle, but in the light emitting device 13, the reflection factor varies within a range of ±60°, and the reflection factor exhibits a maximum value at approximately ±20°. Accordingly, in the light emitting device 13, an increased amount of light is reflected inwardly by the controlling face 19b and advances toward the reflecting face 21.

Figure 8:
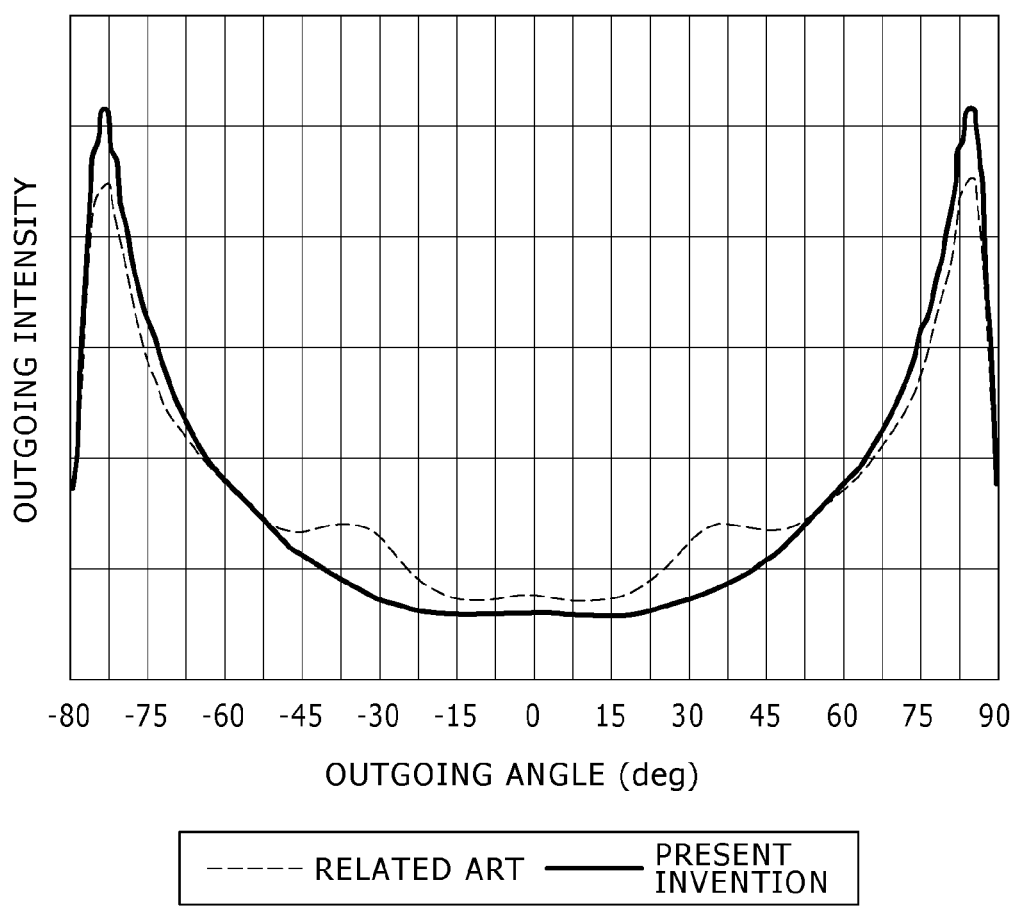
FIG. 8 is a graph illustrating relationships between the outgoing angle and the outgoing intensity in the light emitting device in the related art and the light emitting device of FIG. 3 for comparison.

FIG. 8 is a graph illustrating relationships between the outgoing angle and the outgoing intensity in the light emitting device in the related art and the light emitting device of FIG. 3 for comparison. Referring to FIG. 8, the outgoing angle of 0° is an angle where light is emitted in the direction of the optical axis. In the light emitting device in the related art, the outgoing intensity exhibits a maximum value at an outgoing angle in the proximity of ±40° and exhibits the highest value in the proximity of ±85°. However, in the light emitting device 13, the outgoing intensity only exhibits the highest value at an outgoing angle in the proximity of ±85° but does not exhibit a maximum value at any other outgoing angle. Such a maximum value of the outgoing intensity at an outgoing angle in the proximity of ±40° may possibly make a cause of appearance of luminance unevenness of the display panel 3.

Figure 9:
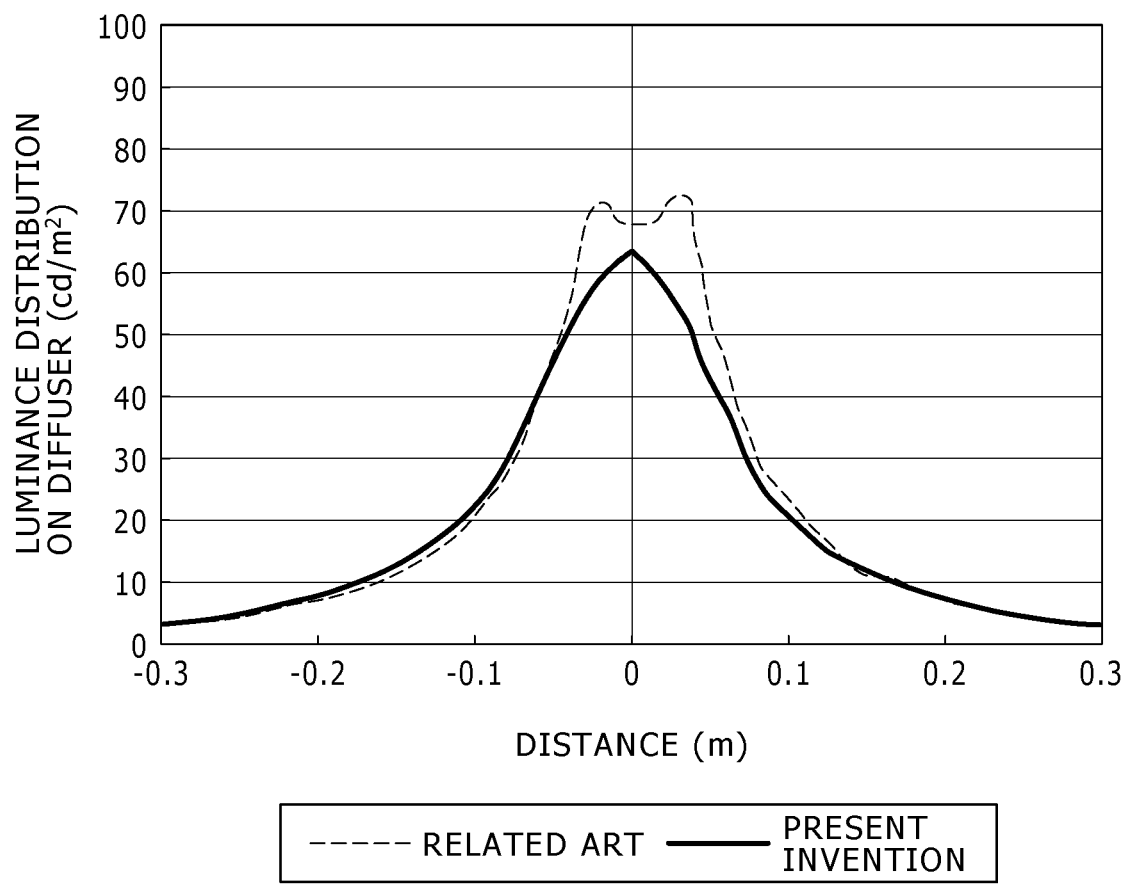
FIG. 9 is a graph illustrating relationships between the distance from a light emitting diode and the luminance distribution on a diffuser in the light emitting device in the related art and the light emitting device of FIG. 3 for comparison.

FIG. 9 is a graph illustrating relationships between the distance from the light emitting diode, that is, the distance in a direction perpendicular to the optical axis, and the luminance distribution on the diffuser in the light emitting device in the related art described hereinabove with reference to FIG. 16 and the light emitting device 13 for comparison. In the light emitting device in the related art, the luminance exhibits two peaks (highest values) within a range of the distance between ±0.1 from 0. Meanwhile, in the light emitting device 13, the luminance exhibits only one peak (highest value) only at the distance of 0. Such two peaks as described above make a cause of reduction of the luminance uniformity of the display panel 3.

It is to be noted that, while FIG. 9 illustrates a luminance distribution when light is emitted from a single light emitting device, the luminance distribution when light is omitted from all light emitting devices used in the image display apparatus is a result of addition of luminance values influenced by light emitted from all light emitting devices at each position on the diffuser. Such a luminance distribution when light is emitted from all light emitting devices as just described is substantially uniformized on the diffuser in the image display apparatus 1 which includes the light emitting devices 13 which exhibit one peak of the luminance only at the distance of 0.

However, in an image display apparatus in the related art which includes light emitting devices which exhibit two peaks of the luminance, the luminance at positions at which the two peaks exist becomes particularly higher than the luminance at the other positions, and this obstructs uniformization of the luminance distribution on the diffuser.

FIG. 10 is a graph illustrating a relationship between the outgoing angle θa from the light emitting diode 15 and the angle θb of the reflection direction of light on the controlling face 19, that is, the angle θb of inward reflection.

The reflection angle θb is an angle in the reflection direction with respect to the optical axis. In the light emitting device 13, while the outgoing angle θa increases from 0° to approximately ±10°, the reflection angle θb increases suddenly, but while the outgoing angle θa increases from approximately ±10°, the reflection angle θb gradually decreases.

The inclination angle θc of the light reflected inwardly by the controlling face 19b with respect to the reflecting face 21 of the light path controlling projecting portion 20 at which the light arrives, that is, the angle θc of the light with respect to a horizontal line in FIG. 10, is determined based on the reflection angle θb. In this instance, the angle at which the light reflected inwardly by the controlling face 19b is totally reflected or reflected inwardly by the reflecting face 21 is calculated, and the thus calculated angle is set as the inclination angle θc.

In the light emitting device 13, the reflecting face 21 is formed as a face which satisfies the inclination angle θc at all positions calculated based on the reflection angle θb in this manner. The reflecting face 21 is formed such that it exhibits a great inclination angle θc where the reflection angle θb is small, but exhibits a small inclination angle θc where the reflection angle θb is great. Accordingly, the light reflected inwardly by the controlling face 19b and arriving at the reflecting face 21 is totally reflected and goes out laterally from the light outgoing face 22. The inclination angle θd of the light outgoing face 22, that is, the angle θd with respect to a horizontal line shown in FIG. 10, is smaller than 90° and is determined so that the light totally reflected by the reflecting face 21 goes out in directions in which the uniformity in luminance on the diffuser can be assured.

Now, a modification to the light emitting device is described with reference to FIGS. 11 to 14.

It is to be noted that the light emitting device 13A according to the modification described below is different from the light emitting device 13 described hereinabove only in that the lens has a different shape and that a coupling layer is provided between the lens and the sealing resin member. Therefore, only such differences are described below in detail.

Figure 11:
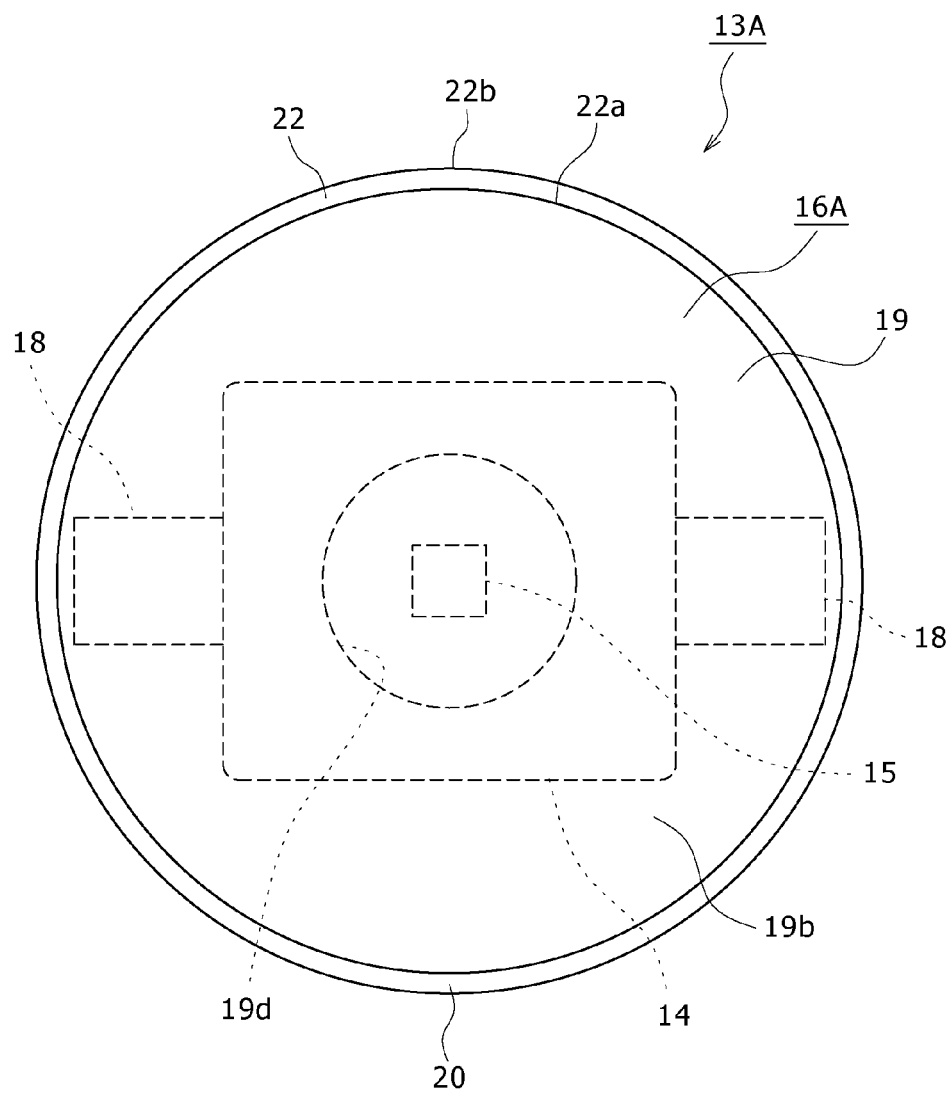
FIGS. 11 and 12 are an enlarged front elevational view and an enlarged side elevational view of a modified light emitting device, respectively.
Figure 12:
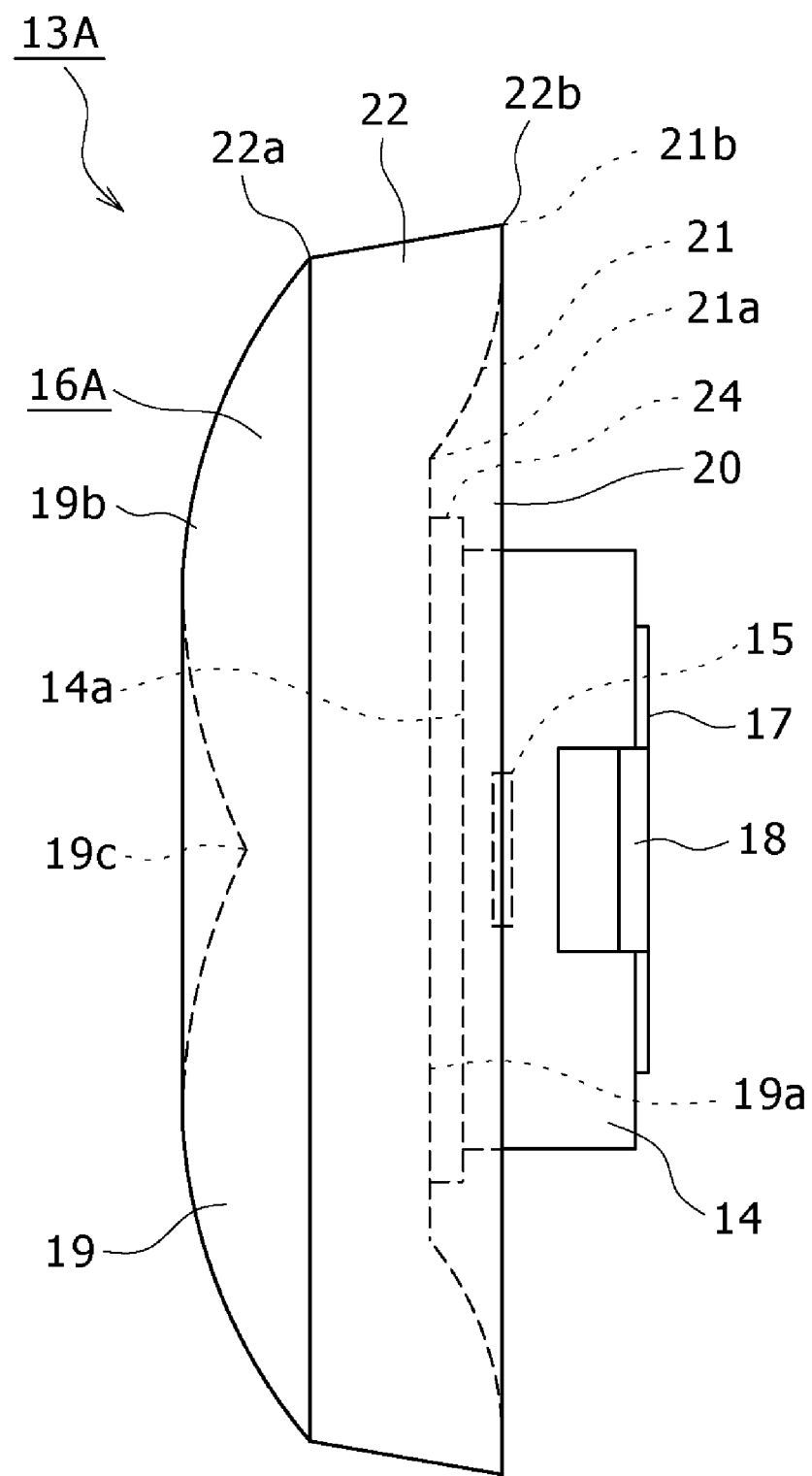
Figure 13:
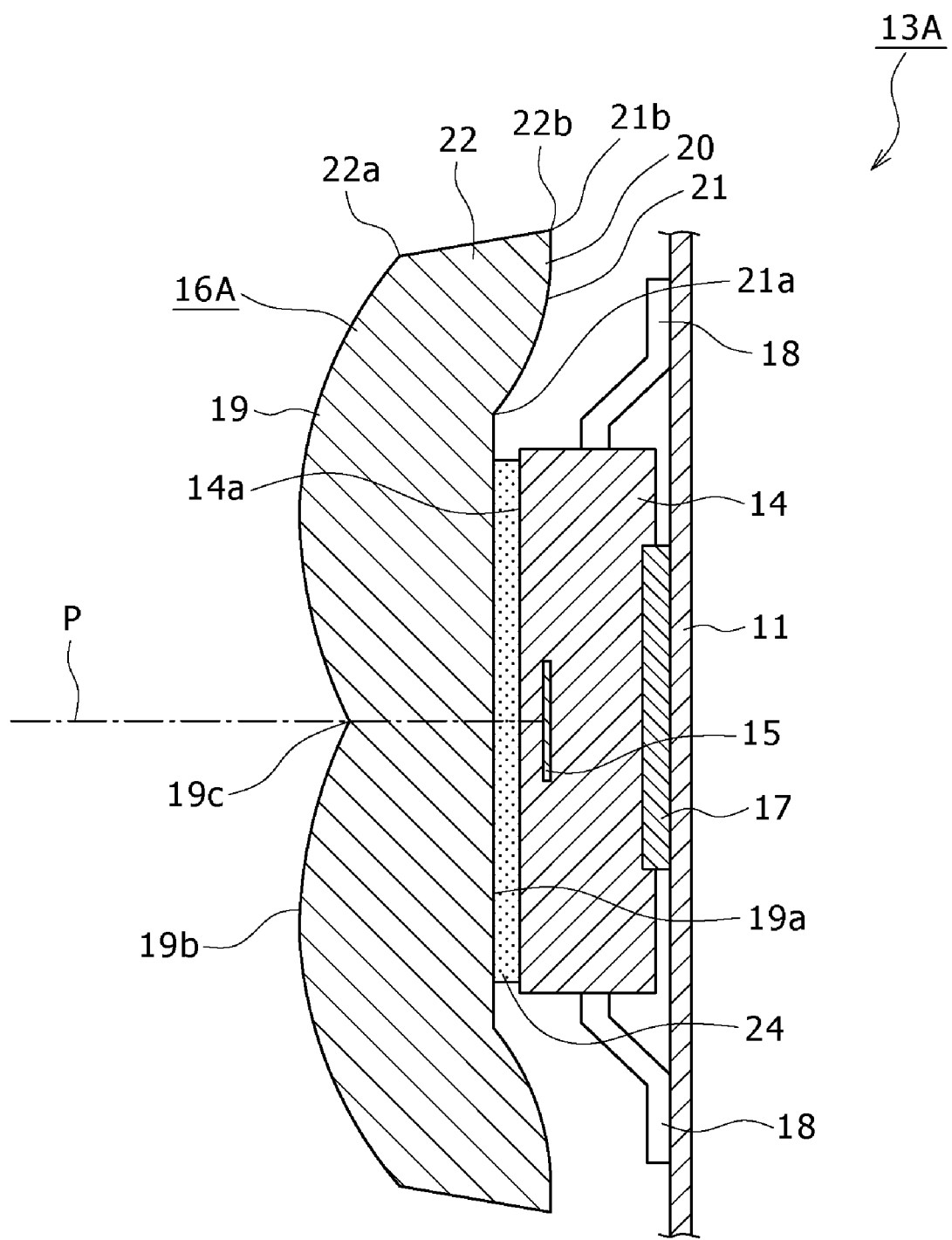
FIG. 13 is an enlarged sectional view showing the modified light emitting device in a state wherein it is disposed on a circuit board.

Referring first to FIGS. 11 to 13, the light emitting device 13 includes a sealing resin member 14, a light emitting diode 15 which functions as a backlight light source, and a lens 16A disposed on the sealing resin member 14 with a coupling layer 24 interposed therebetween.

The lens 16A is formed from a transparent resin material such as a polycarbonate resin material and has a circular shape as viewed in the direction of an optical axis of light emitted from the light emitting diode 15. The lens 16A is disposed on the arrangement face 14a with the coupling layer 24 interposed therebetween such that the optical axis P (refer to FIG. 13) thereof coincides with the optical axis.

The coupling layer 24 is formed from a transparent material having an adhesive property such as silicone gel. The refractive index of the coupling layer 24 is, for example, 1.49, and the refractive index of the lens 16A formed from polycarbonate is, for example, 1.59.

The sealing resin member 14 is formed, at a portion thereof which corresponds to the central portion of the coupling layer 24 and has the light emitting diode 15 buried therein, for example, from silicone, an epoxy resin or the like. The refractive index of the silicone is, for example, 1.41 to 1.50, and the refractive index of the epoxy resin is, for example, 1.40 to 1.60.

The lens 16A includes a body portion 19A and a light path controlling projecting portion 20 provided continuously to an outer periphery of the body portion 19A so as to be integral with the body portion 19A. Different from the body portion 19, the body portion 19A does not have a recess 19d formed therein for forming an air layer 23.

The light emitting device 13A is formed such that the attached face 19a of the lens 16A contacts with the front face of the coupling layer 24 and the arrangement face 14a of the sealing resin member 14 contacts with the rear face of the coupling layer 24 while the lens 16A and the sealing resin member 14 are adhered to each other by the coupling layer 24.

Figure 14:
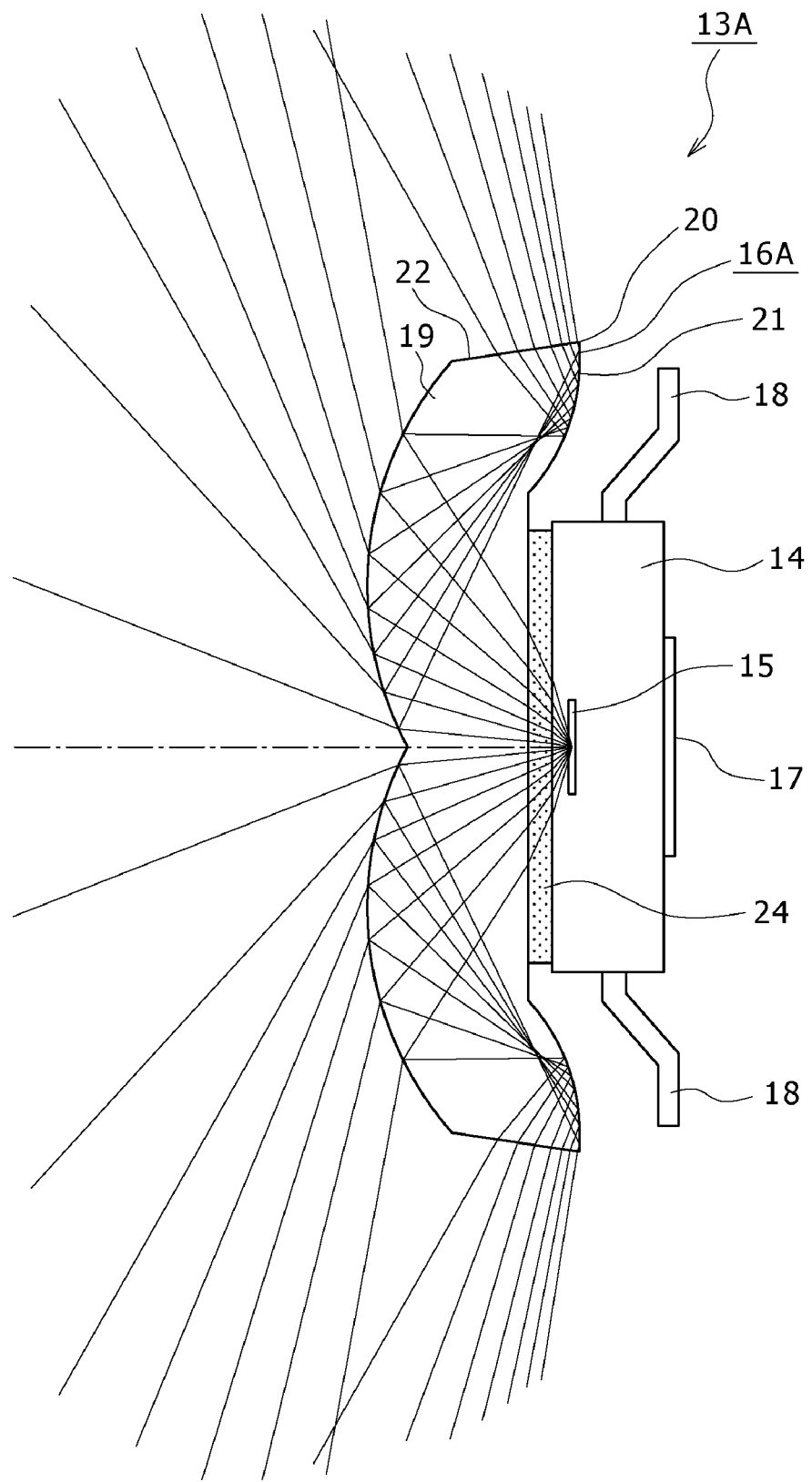
FIG. 14 is a schematic view illustrating paths of light emitted from a light emitting diode of the modified light emitting device.

In the light emitting device 13A, if light is emitted from the light emitting diode 15, then the emitted light advances at a predetermined outgoing angle toward the controlling face 19b of the lens 16A as seen in FIG. 14. At this time, since the refractive index (1.49) of the coupling layer 24 and the refractive index (1.41 to 1.50) of the sealing resin member 14 are adjusted to the substantially same value, the light emitted from the light emitting diode 15 arrives at the controlling face 19b almost without being refracted at the boundary surface of the sealing resin member 14 and the coupling layer 24.

The light arriving at the controlling face 19b goes out from the controlling face 19b except part thereof at a ratio according to the incoming angle to the controlling face 19b and then arrives at the display panel 3 through the diffuser 9 and the optical sheet 8.

The part of light arriving at the controlling face 19b is reflected inwardly by the controlling face 19b and is then reflected inwardly by the reflecting face 21 of the light path controlling projecting portion 20 again, and then goes out from the light outgoing face 22 and comes to the display panel 3 through the diffuser 9 and the optical sheet 8.

Since, in the light emitting device 13A, the coupling layer 24 is provided between the lens 16A and the sealing resin member 14 as described above, the lens 16A and the coupling layer 24 contact closely with each other and the coupling layer 24 and the sealing resin member 14 contact closely with each other. Therefore, an unnecessary gap is not formed between the lens 16A and the sealing resin member 14, and consequently, light emitted from the light emitting diode 15 is prevented from being directed to an unintended direction and control of the light can be carried out readily.

Further, since no air layer exists between the lens 16A and the sealing resin member 14, the light emitting device 13A can be formed with a thickness reduced as much.

Further, since the coupling layer 24 and the sealing resin member 14 have a substantially equal refractive index, interface reflection is less likely to occur at the boundary surface between the coupling layer 24 and the sealing resin member 14, and improvement of the utilization efficiency of light can be achieved as much.

Furthermore, since a resin material in the form of gel is used for the coupling layer 24, good close contact is assured between the lens 16A and the coupling layer 24 and between the coupling layer 24 and the sealing resin member 14. Consequently, facilitation of the control of light emitted from the light emitting diode 15 can be anticipated.

In addition, since a material having an adhesive property is used for the coupling layer 24, there is no necessity to provide a securing element for the sealing resin member 14 such as a caulking pin on the lens 16A, and consequently, simplification in structure can be anticipated.

FIG. 15 is a graph illustrating a relationship between the outgoing angle θa from the light emitting diode 15 and the angle θb of the reflection direction of light on the controlling face 19b, that is, the angle of inward reflection, in the modified light emitting device 13A.

The reflection angle θb is an angle of the light in the reflection direction with respect to the optical axis. In the light emitting device 13A, the reflection angle θb increases suddenly while the outgoing angle θa increases from 0° to approximately ±10°, but the reflection angle θb decreases gradually while the outgoing angle θa increases from approximately ±10°.

The inclination angle θc of the light reflected inwardly by the controlling face 19b with respect to the reflecting face 21 of the light path controlling projecting portion 20 at which the light arrives, that is, the angle θc of the light with respect to a horizontal line in FIG. 15, is determined based on the reflection angle θb. In this instance, the angle at which the light reflected inwardly by the controlling face 19b is totally reflected or reflected inwardly by the reflecting face 21 is calculated, and the thus calculated angle is set as the inclination angle θc.

Also in the light emitting device 13A, the reflecting face 21 is formed as a face which satisfies the inclination angle θc at all positions calculated based on the reflection angle θb similarly as in the light emitting device 13. The reflecting face 21 is formed such that it exhibits a great inclination angle θc where the reflection angle θb is small, but exhibits a small inclination angle θc where the reflection angle θb is great. Accordingly, the light reflected inwardly by the controlling face 19b and arriving at the reflecting face 21 is totally reflected and goes out laterally from the light outgoing face 22. The inclination angle θd of the light outgoing face 22, that is, the angle θd with respect to a horizontal line shown in FIG. 15, is smaller than 90° and is determined so that the light totally reflected by the reflecting face 21 goes out in directions in which the uniformity in luminance on the diffuser can be assured.

As described above, in the light emitting devices 13 and 13A, since the light path controlling projecting portion 20 having the reflecting face 21 for reflecting light reflected inwardly once inwardly again and the light outgoing face 22 from which the light reflected inwardly by the reflecting face 21 goes out is provided on the outer periphery of the lens 16 or 16A, the amount of light which goes out laterally with respect to the optical axis from within light emitted from the light emitting diode 15 is great. Consequently, uniformity of the luminance can be assured, and appearance of unevenness of the luminance on the display panel 3 can be prevented.

The particular shapes and structures of the elements described hereinabove in connection with the preferred embodiment of the present invention and the modification to the embodiment represent a mere example in carrying out the present invention, and the technical scope of the present invention shall not interpreted restrictively by them.

It should be understood by those skilled in the art that various modifications, combinations, sub-combinations and alterations may occur depending on design requirements and other factor in so far as they are within the scope of the appended claims or the equivalents thereof.

What is claimed is:

1. A light emitting device, comprising:
a light emitting diode;
an sealing resin member having an arrangement face and configured to seal said light emitting diode; and
a lens disposed on said arrangement face of said sealing resin member and formed so as to have a circular shape as viewed in the direction of an optical axis of light emitted from said light emitting diode, said lens having a concave portion formed at a central portion in such a manner as to be concave toward said sealing resin member,
wherein,
said lens is disposed on said arrangement face of said sealing resin member such that said concave portion of said lens is positioned on the optical axis of the light emitted from said light emitting diode;
the light emitted from said light emitting diode partly passes through said sealing resin member, whereafter the light is reflected inwardly by said lens and goes out from said lens;
said lens has a light path controlling projecting portion provided on an outer periphery such that said light path controlling projecting portion is positioned outside of said sealing resin member and introduces the light reflected inwardly by said lens to a predetermined direction;
said light path controlling projecting portion has a reflecting face for reflecting the light reflected inwardly by said lens inwardly again and a light outgoing face provided continuously to an outer peripheral edge of said reflecting face for allowing the light reflected inwardly by said reflecting face to go out;
said reflecting face has an inner circumferential edge positioned on the emitting direction side of the light from said light emitting diode with respect to an outer circumferential edge along the direction of the optical axis;
said reflecting face is formed as a curved face convex to the substantially opposite side to the emitting direction of the light from said light emitting diode along the direction of the optical axis; and
said light outgoing face forms an outer circumferential face of said light path controlling projecting portion while said light outgoing face is inclined so as to be displaced away from said light emitting diode as the distance to the outer circumferential edge of said reflecting face decreases in the direction of the optical axis.

2. The light emitting device according to claim 1, wherein said lens and said sealing resin member define an air layer through which the light emitted from said light emitting diode passes.

3. The light emitting device according to claim 1, further comprising a transparent coupling layer provided between said lens and said sealing resin member for coupling said lens and said sealing resin member to each other.

4. The light emitting device according to claim 3, wherein said coupling layer and said sealing resin member have substantially equal refractive indices.

5. The light emitting device according to claim 3, wherein said coupling layer is formed from a resin material in the form of a gel.

6. The light emitting device according to claim 3, wherein said coupling layer is formed from an adhesive.

7. An area light source apparatus, comprising:
a plurality of light emitting devices each including a light emitting diode, an sealing resin member having an arrangement face and configured to seal said light emitting diode, and a lens disposed on said arrangement face of said sealing resin member and formed so as to have a circular shape as viewed in the direction of an optical axis of light emitted from said light emitting diode, said lens having a concave portion formed at a central portion in such a manner as to be concave toward said sealing resin member; and
diffusion means for diffusing the light emitted from said plural light source apparatus,
wherein,
said lens is disposed on said arrangement face of said sealing resin member such that said concave portion of said lens is positioned on the optical axis of the light emitted from said light emitting diode;
the light emitted from said light emitting diode partly passes through said sealing resin member, whereafter the light is reflected inwardly by said lens and goes out from said lens;
said lens has a light path controlling projecting portion provided on an outer periphery such that said light path controlling projecting portion is positioned outside of said sealing resin member and introduces the light reflected inwardly by said lens to a predetermined direction;
said light path controlling projecting portion has a reflecting face for reflecting the light reflected inwardly by said lens inwardly again and a light outgoing face provided continuously to an outer peripheral edge of said reflecting face for allowing the light reflected inwardly by said reflecting face to go out;
said reflecting face has an inner circumferential edge positioned on the emitting direction side of the light from said light emitting diode with respect to an outer circumferential edge along the direction of the optical axis;
said reflecting face is formed as a curved face convex to the substantially opposite side to the emitting direction of the light from said light emitting diode along the direction of the optical axis;
said light outgoing face forms an outer circumferential face of said light path controlling projecting portion while said light outgoing face is inclined so as to be displaced away from said light emitting diode as the distance to the outer circumferential edge of said reflecting face decreases in the direction of the optical axis.

8. An image display apparatus, comprising:
a plurality of light emitting devices each including a light emitting diode, an sealing resin member having an arrangement face and configured to seal said light emitting diode, and a lens disposed on said arrangement face of said sealing resin member and formed so as to have a circular shape as viewed in the direction of an optical axis of light emitted from said light emitting diode, said lens having a concave portion formed at a central portion in such a manner as to be concave toward said sealing resin member;
diffusion means for diffusing the light emitted from said plural light source apparatus; and
a display panel upon which the light emitted from said plural light emitting devices is irradiated to display an image,
wherein,
said lens is disposed on said arrangement face of said sealing resin member such that said concave portion of said lens is positioned on the optical axis of the light emitted from said light emitting diode;

the light emitted from said light emitting diode partly passes through said sealing resin member, whereafter the light is reflected inwardly by said lens and goes out from said lens;

said lens has a light path controlling projecting portion provided on an outer periphery such that said light path controlling projecting portion is positioned outside of said sealing resin member and introduces the light reflected inwardly by said lens to a predetermined direction;

said light path controlling projecting portion has a reflecting face for reflecting the light reflected inwardly by said lens inwardly again and a light outgoing face provided continuously to an outer peripheral edge of said reflecting face for allowing the light reflected inwardly by said reflecting face to go out;

said reflecting face has an inner circumferential edge positioned on the emitting direction side of the light from said light emitting diode with respect to an outer circumferential edge along the direction of the optical axis;

said reflecting face is formed as a curved face convex to the substantially opposite side to the emitting direction of the light from said light emitting diode along the direction of the optical axis; and said light outgoing face forms an outer circumferential face of said light path controlling projecting portion while said light outgoing face is inclined so as to be displaced away from said light emitting diode as the distance to the outer circumferential edge of said reflecting face decreases in the direction of the optical axis.

* * * * *